United States Patent
Bartlett et al.

(10) Patent No.: US 11,256,314 B2
(45) Date of Patent: Feb. 22, 2022

(54) SYSTEM AND METHOD FOR POWER MANAGEMENT OF FIELD-PROGRAMMABLE GATE ARRAYS AND LOAD BALANCING OF PERSONALITY BITSTREAMS FROM A BASEBOARD MANAGEMENT CONTROLLER

(71) Applicant: DELL PRODUCTS, LP, Round Rock, TX (US)

(72) Inventors: Jeremiah James Bartlett, Austin, TX (US); Pavan Kumar Gavvala, Bangalore (IN); Rama Rao Bisa, Bangalore (IN); Johan Rahardjo, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 230 days.

(21) Appl. No.: 16/537,205

(22) Filed: Aug. 9, 2019

(65) Prior Publication Data

US 2021/0041933 A1 Feb. 11, 2021

(51) Int. Cl.
| | |
|---|---|
| *G06F 1/26* | (2006.01) |
| *G06F 1/32* | (2019.01) |
| *G06F 1/3206* | (2019.01) |
| *G06F 1/329* | (2019.01) |
| *G06F 30/34* | (2020.01) |

(52) U.S. Cl.
CPC ............ *G06F 1/3206* (2013.01); *G06F 1/329* (2013.01); *G06F 30/34* (2020.01)

(58) Field of Classification Search
CPC ........ G06F 1/3206; G06F 30/34; G06F 1/329; G06F 1/3287; G06F 1/3243; G06F 1/206
See application file for complete search history.

(56) References Cited

U.S. PATENT DOCUMENTS

| | | | |
|---|---|---|---|
| 8,701,069 B1* | 4/2014 | Dimond | G06F 30/34 716/117 |
| 9,413,388 B1 | 8/2016 | Khemani | |
| 9,762,418 B2 | 9/2017 | Berke et al. | |
| 10,038,705 B2 | 7/2018 | Jreij et al. | |
| 10,651,853 B1* | 5/2020 | Kong | H03K 19/1776 |

(Continued)

FOREIGN PATENT DOCUMENTS

CN 109032853 A * 12/2018 .............. G06F 11/18

OTHER PUBLICATIONS

Zhang Zhao, English Translation of CN 109032853 A1, 2018 (Year: 2018).*

*Primary Examiner* — Xuxing Chen
(74) *Attorney, Agent, or Firm* — Larson Newman, LLP

(57) ABSTRACT

An information handling system includes a processor, a system baseboard management controller (BMC), and a field-programmable gate array (FPGA) add-in card. The FPGA add-in card includes an FPGA programmed with accelerated function units (AFUs) to perform processing tasks for the processor. The AFUs include AFUs of a common type. A card BMC provides a temperature indication to the system BMC. The system BMC determines that a temperature of the FPGA add-in card exceeds a temperature threshold based upon the temperature indication, selects one of the common AFUs to be disabled, and directs the card BMC to disable the selected AFU. The card BMC disables the first AFU and not the second AFU in response to the direction to disable the first AFU.

20 Claims, 8 Drawing Sheets

(56) References Cited

U.S. PATENT DOCUMENTS

| | | |
|---|---|---|
| 2007/0157035 A1* | 7/2007 | Gumma ................ G06F 1/3225 |
| | | 713/300 |
| 2007/0192610 A1 | 8/2007 | Chun et al. |
| 2008/0184047 A1* | 7/2008 | Goeltzenleuchter ........................ |
| | | G06F 1/3203 |
| | | 713/320 |
| 2012/0265912 A1 | 10/2012 | Hess et al. |
| 2014/0365714 A1* | 12/2014 | Sweere ................ G06F 1/3268 |
| | | 711/103 |
| 2015/0095687 A1* | 4/2015 | Spry .................... G06F 1/3278 |
| | | 713/324 |
| 2015/0100930 A1 | 4/2015 | Allred et al. |
| 2016/0055119 A1 | 2/2016 | Egi et al. |
| 2016/0321081 A1 | 11/2016 | Kim et al. |
| 2018/0196103 A1 | 7/2018 | Champoux et al. |
| 2018/0357090 A1 | 12/2018 | Butcher et al. |
| 2019/0004816 A1 | 1/2019 | Khatri et al. |
| 2019/0108145 A1* | 4/2019 | Raghava ............... G06F 13/124 |
| 2019/0303172 A1 | 10/2019 | Takahashi et al. |
| 2019/0339747 A1* | 11/2019 | Hsieh .................... G06F 1/188 |
| 2020/0132761 A1* | 4/2020 | Rahardjo ........... G01R 31/3177 |
| 2020/0133759 A1* | 4/2020 | Arzola ................ G06F 11/0745 |

* cited by examiner

500

| A | A | A | A | A | A |
|---|---|---|---|---|---|
| A | A | A | A | A | A |
| A | A | A | A | A | A |
| B | B | B | B | C | C |
| B | B | B | B | C | C |
| B | B | B | B | C | C |

Before Thermal Event

500

| A | A | A |   |   |   |
|---|---|---|---|---|---|
| A | A | A |   |   |   |
| A | A | A |   |   |   |
| B | B |   |   | C |   |
| B | B |   |   | C |   |
| B | B |   |   | C |   |

After Thermal Event

FIG. 5

SYSTEM AND METHOD FOR POWER MANAGEMENT OF FIELD-PROGRAMMABLE GATE ARRAYS AND LOAD BALANCING OF PERSONALITY BITSTREAMS FROM A BASEBOARD MANAGEMENT CONTROLLER

RELATED APPLICATIONS

Related subject matter is contained in co-pending U.S. patent application Ser. No. 16/537,097 entitled "System and Method to Change Field-Programmable Gate Array Personality from a Baseboard Management Controller," filed of even date herewith, the disclosure of which is hereby incorporated by reference.

Related subject matter is contained in co-pending U.S. patent application Ser. No. 16/537,238 entitled "System and Method for Providing Heterogeneous Personality Bitstreams on Field-Programmable Gate Arrays from a Baseboard Management Controller," filed of even date herewith, the disclosure of which is hereby incorporated by reference.

FIELD OF THE DISCLOSURE

This disclosure generally relates to information handling systems, and more particularly relates to power management of field-programmable gate arrays and load balancing of personality bitstreams from a baseboard management controller.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. The use of the same reference symbols in different drawings indicates similar or identical items. Embodiments incorporating teachings of the present disclosure are shown and described with respect to the drawings presented herein, in which:

FIG. 5 is an illustration of the AFUs programmed on an FPGA according to an embodiment of the present disclosure;

SUMMARY

An information handling system may include a processor, a system baseboard management controller (BMC), and a field-programmable gate array (FPGA) add-in card. The FPGA add-in card may include an FPGA and a card BMC. The FPGA may be programmed with accelerated function units (AFUs) to perform processing tasks for the processor. The card BMC may receive a first indication to halt a first processing task associated with a first AFU from the system BMC, halt the first processing task in response to the first indication, receive a second AFU from the system BMC, and reprogram the FPGA with the second AFU.

The AFUs may further include a AFUs of a common type. The card BMC may provide a temperature indication to the system BMC. The system BMC may receive the temperature indication, determine that a temperature of the FPGA add-in card exceeds a temperature threshold based upon the temperature indication, select one of the common AFUs to be disabled, and direct the card BMC to disable the selected AFU. The card BMC may disable the first AFU and not the second AFU in response to the direction to disable the first AFU An information handling system may include a processor and first and second field-programmable gate array (FPGA) add-in cards. The processor may determine a configuration of the information handling system, the configuration defining architectural relationships among the first and second FPGA add-in cards and elements of the information handling system, determine that an accelerated function unit (AFU) performs its associated processing task more efficiently on the first FPGA add-in card than on the second FPGA add-in card based upon the configuration, and program the first AFU on the first FPGA card-in based upon the determination that the first AFU performs its associated processing task more efficiently on the first FPGA add-in card than on the second FPGA add-in card.

DETAILED DESCRIPTION OF DRAWINGS

The following description in combination with the Figures is provided to assist in understanding the teachings disclosed herein, and will focus on specific implementations and embodiments of the teachings. This focus is provided to assist in describing the teachings, and should not be interpreted as limiting the scope or applicability of the teachings. Moreover, other teachings can be used along with the teachings of this disclosure, and the teachings of this disclosure can be used along with other disclosures.

Figure 1:
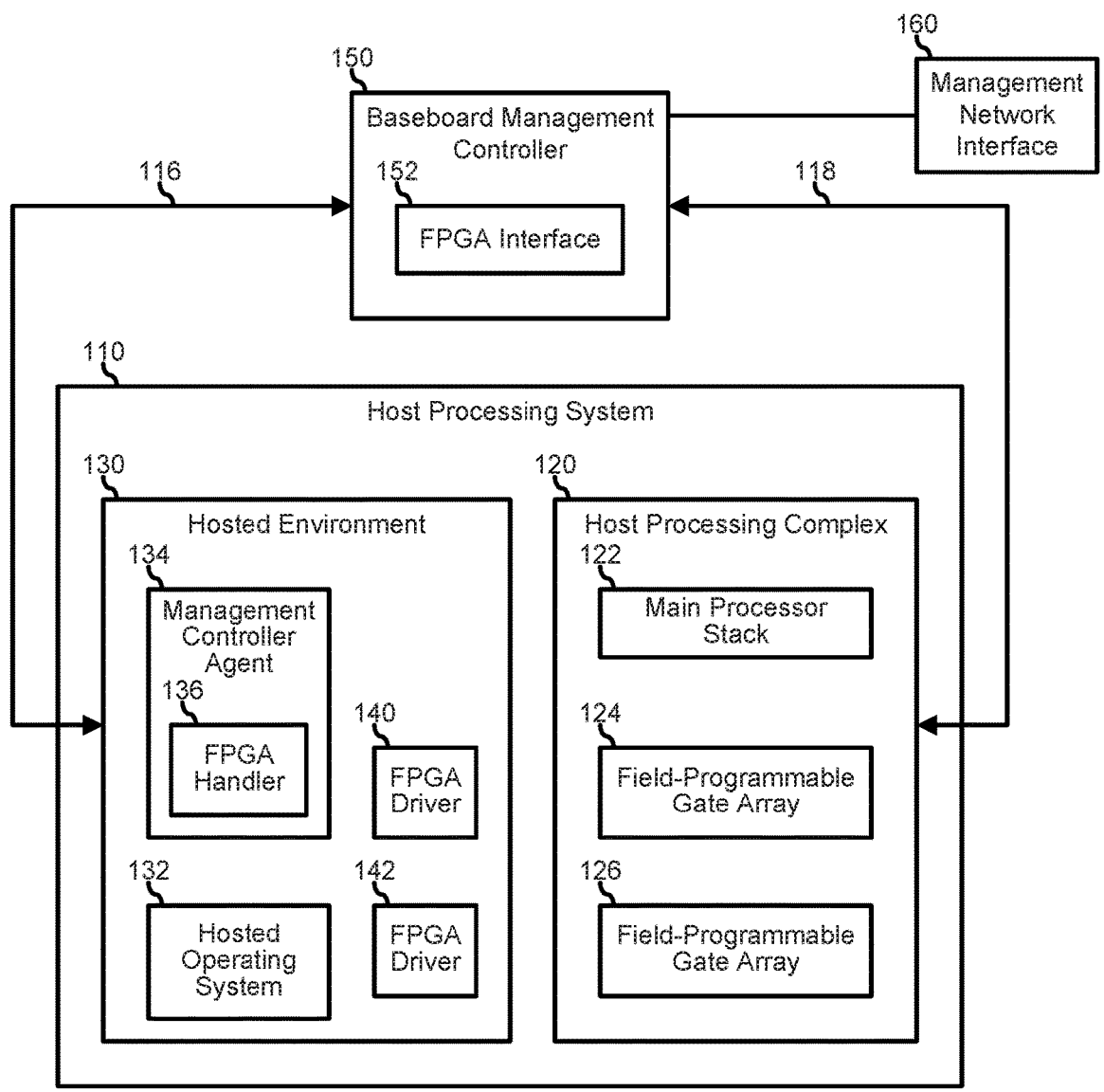
FIG. 1 is a block diagram of an information handling system including field-programmable gate arrays (FPGAs) according to an embodiment of the present disclosure.

FIG. 1 illustrates an information handling system 100 including a host processing system 110, a baseboard management controller (BMC) 150, and a management network interface 160. Host processing system 110 includes a host processing complex 120 and a hosted environment 130. Host processing complex 120 represents the main processing elements of information handling system 100, including a main processor stack 122, and field-programmable gate arrays (FPGAs) 124 and 126. Main processor stack 122 represents hardware including one or more processors, chipset elements, storage devices, memory devices, I/O devices, and the like. FPGAs 124 and 126 represent processing resources of host processing complex 120 that can be utilized to offload main processor stack 122 from various functions as needed or desired.

Hosted environment 130 includes a hosted OS 132, a BMC agent 134, and FPGA drivers 140 and 142. Hosted environment 130 represents a processing environment instantiated in code on host processing complex 120, and can include a BIOS or UEFI for information handling system 100, other firmware, device drivers, and the like, that establish the core operating code for establishing the hosted environment, and to launch hosted OS 132 on the host processing complex. Hosted OS 132 operates to manage the runtime aspects of hosted environment 130, to launch programs and applications on host processing complex 120, and to launch, manage, maintain, and halt tasks on FPGAs 124 and 126. FPGA drivers 140 and 142 operate to control FPGAs 124 and 126, and to provide an interface to enable hosted OS 132 and other components of hosted environment 130 to access the FPGAs. In a particular embodiment, one or more of FPGAs 124 and 126 include vendor specific functions and features for configuring, monitoring, and controlling the FPGAs. Such vendor specific functions and features are accessible to hosted environment 130 via FPGA drivers 140 and 142.

BMC 150 is connected via an interface 116 to interact with various functions and features of hosted environment 130, and is connected via an out-of-band interface 118 to interact with various functions and features of host processing complex 120. In particular, BMC 150 interacts with the various functions and features of hosted environment 130 via a management system agent 134 that is instantiated in the hosted environment to permit a user connected to the BMC to obtain status information from the pre-boot and runtime elements of the hosted environment, including the programs and applications instantiated in the hosted environment. The user can also provide commands and otherwise control the operations of the programs and applications, including directing hosted OS 132 to launch a program, application, or task, to modify the runtime operation of a program, application, or task, and to halt the execution of a program, application, or task, as needed or desired. Interface 116 represents a communication path between hosted environment 130 and BMC 150, as is known in the art, and can include a keyboard controller style (KCS) interface, a USB-NIC interface, an OS-to-BMC pass-through interface, or the like.

BMC 150 includes a FPGA interface module 152 that interacts with the various in-band functions and features of FPGA drivers 140 and 142 via a FPGA handler module 136 of management system agent 134 to permit the user to obtain status information from the tasks instantiated on FPGAs 124 and 126, and to access the in-band monitoring features of the FPGAs. FPGA interface module 152, interacting with FPGA handler module 136 also permits the user to provide commands and otherwise control the operations of FPGAs 124 and 126 or to manage the tasks running on the FPGAs, including directing hosted OS 132 to launch a task, to modify the runtime operation of a task, and to halt the execution of a task, as needed or desired.

BMC 150 also interacts out-of-band with the various functions and features of host processing complex 120. In particular, FPGA interface module 152 interacts out-of-band with FPGAs 124 and 126. For example, FPGA interface module 152 can receive out-of-band status information from FPGAs 124 and 126. Note that the status information that is available from FPGAs 124 and 126 via out-of-band interface 118 may be the same as, or different from the status information that is available from FPGA drivers 140 and 142, as may be determined by the particular FPGA vendor, or as otherwise dictated by design related choices, as needed or desired.

FPGA interface module 152 provides a management interface that permits a user that is connected to BMC 150 via management network interface 160 to select one or more of FPGAs 124 and 126, and to view the current operating status of the selected FPGA, such as by identifying the tasks currently being run on the selected FPGA, or the like, or by otherwise displaying information related to the status of the selected FPGA. Here, FPGA interface module 152 directs FPGA handler module 136 to retrieve the requested information from hosted environment 130, from hosted OS 132, or directly retrieves the requested information from the selected one of FPGAs 124 and 126 via out-of-band interface 118. FPGA interface module 152 then provides the retrieved information to the user.

Figure 2:
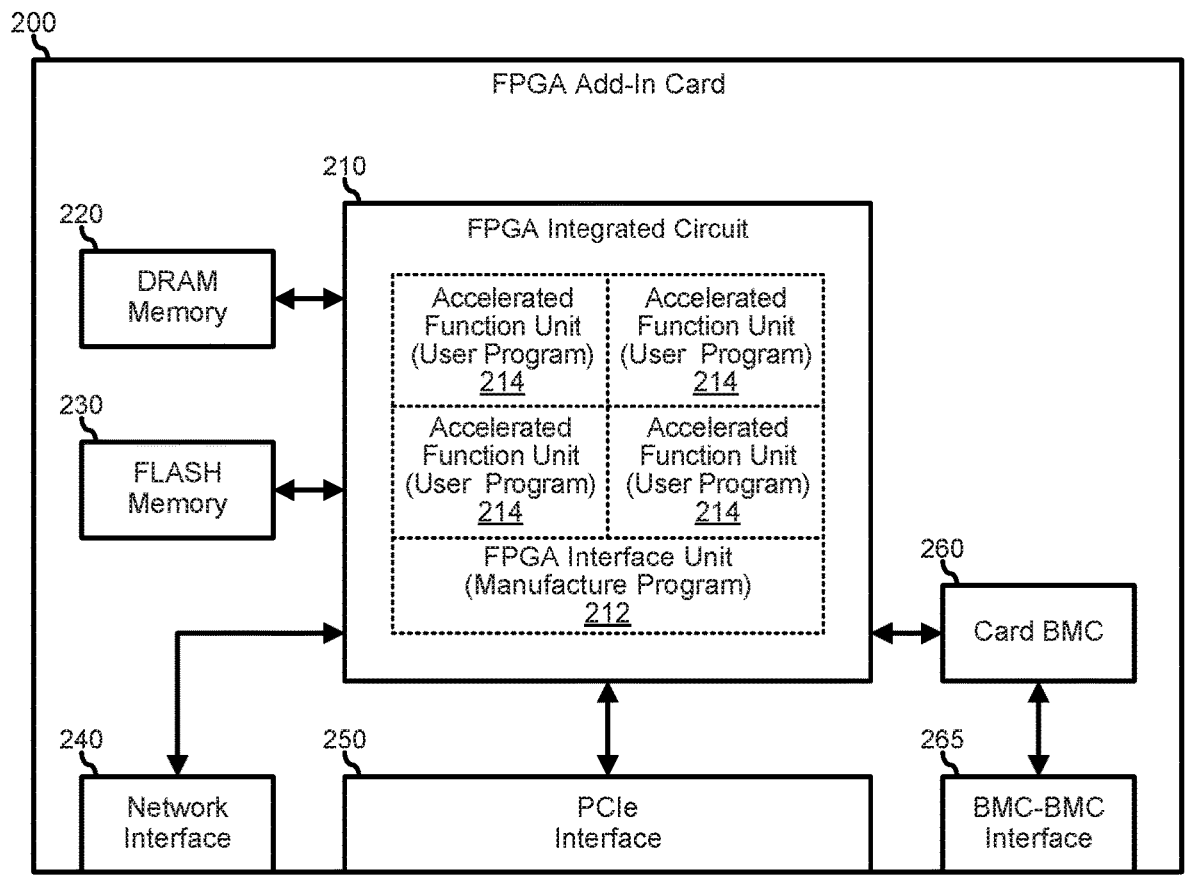
FIG. 2 is a block diagram of an FPGA add-in card according to an embodiment of the present disclosure.

FPGAs are increasingly being utilized as high performance accelerators in various server applications, where a typical server may employ one or more FPGAs. FIG. 2 illustrates FPGA add-in card 200 that can be plugged into a communication interface of a server system. FPGA add-in card 200 includes FPGA integrated circuit 210, one or more Dynamic Random Access Memory (DRAM) devices 220, one or more FLASH memory device 230, a network interface 240, a PCIe interface 250, a card BMC 260, and a BMC-to-BMC interface 265. FPGA add-in card 200 provides the functions and features of an FPGA, but packaged so as to be easily incorporated into the architecture of an information handling system. FPGA integrated circuit 210 represents an FPGA device that is configured to provide hardware acceleration for various types of processing task and that is flexible to be configured to perform its intended processing tasks.

DRAM memory device 220 represents a volatile memory device that is accessible for storage of data to be consumed by, or produced by FPGA integrated circuit 210 or other functions of FPGA add-in card 200. Flash memory device 230 represents a non-volatile memory device for storing firmware for FPGA add-in card 200 and for storing other configuration information related to the FPGA add-in card 200. Network interface 240 represents a port for connecting to a network external to the information handling system into which FPGA add-in card 200 is installed. An example includes an Ethernet network, a Fibre Channel network, or another network, as needed or desired. In a particular embodiment, network interface 240 represents one or more Quad Small Form-Factor Pluggable (QSFP) modules. PCIe interface 250 represents a high-speed serial data interface in accordance with a PCIe specification. An example of PCIe interface 250 includes a four-lane (×4) link, an eight-lane (×8) link, a 16-lane (×16) link, or a link with another number of lanes as needed or desired. PCIe interface 250 represent a main data communication link between FPGA add-in card 200 and the information handling system into which the FPGA add-in card is installed for interacting with the programs and software instantiated in an operating system of the information handling system to perform the processing tasks as described below. Card BMC 260 represents a processor or controller of FPGA add-in card 200 for the monitoring, management, and maintenance of the functions and features of the FPGA add-in card. Card BMC 260 can operate in accordance with an Intelligent Platform Management Interface (IPMI) to provide the monitoring, managing, and maintaining of the functions and features out-of-band from an operating system instantiated on an information handling system into which FPGA add-in card 200 is installed. Here, card BMC 260 will typically be part of a management network of the information handling system that includes a BMC for the information handling system. Hence card BMC 260 will be connected to the system BMC via BMC-to-BMC interface 265. Thus BMC-to-BMC interface 265 operates to couple card BMC 260 to a management network of the information handling system for out-of-band communication between the card BMC and the elements of the information handling system. Examples of an management network interface may include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a Peripheral Component Interconnect-Express (PCIe) interface, a Network Controller Sideband Interface (NC-SI), or the like. As used herein, out-of-band access refers to operations performed apart from a BIOS/operating system execution environment on the information handling system, that is apart from the execution of code by processors of the information handling system and procedures that are implemented on the information handling system in response to the executed code.

FPGA integrated circuit 210 executes FPGA Interface Unit (FIU) program 212, which is provided by the manufacturer of the FPGA integrated circuit of FPGA add-in card 200 and one or more Accelerated Function Unit (AFU) 214, which is provided by a user of the information handling system into which FPGA add-in card 200 is installed. The FIU 212; also referred to as the "Blue Bit Stream" where FPGA add-in card 200 represents an FPGA add-in card manufactured by Intel Corp.; provides a platform interface layer between FPGA integrated circuit 210 and the other interfaces of FPGA add-in card 200, such as DRAM device 220, FLASH memory device 230, network interface 240, PCIe interface 250, and card BMC 260. The AFUs, also referred to as the "Green Bit Streams" where FPGA add-in card 200 represents an FPGA add-in card manufactured by Intel Corp., provide the user intellectual property (IP) that uniquely programs FPGA integrated circuit 210 to perform the intended processing tasks. The FIU 212 is pre-configured at the time of manufacture, and, with the exception of periodic firmware updates from the manufacturer of FPGA add-in card 200, is intended to stay unchanged during the life of the FPGA add-in card. On the other hand, the AFUs 214 are meant to be programmed in accordance with the desired processing task to be performed by FPGA add-in card 200. Hence FPGAs are referred to as being "field programmable." In this regard, the AFUs 214 may be programmed to FPGA during a system boot process of the information handling system into which FPGA add-in card 200 is installed, or during run time on an operating system instantiated on the information handling system, and FPGA integrated circuit 210 can be reprogrammed with different AFUs as needed or desired during the run time.

Figure 3:
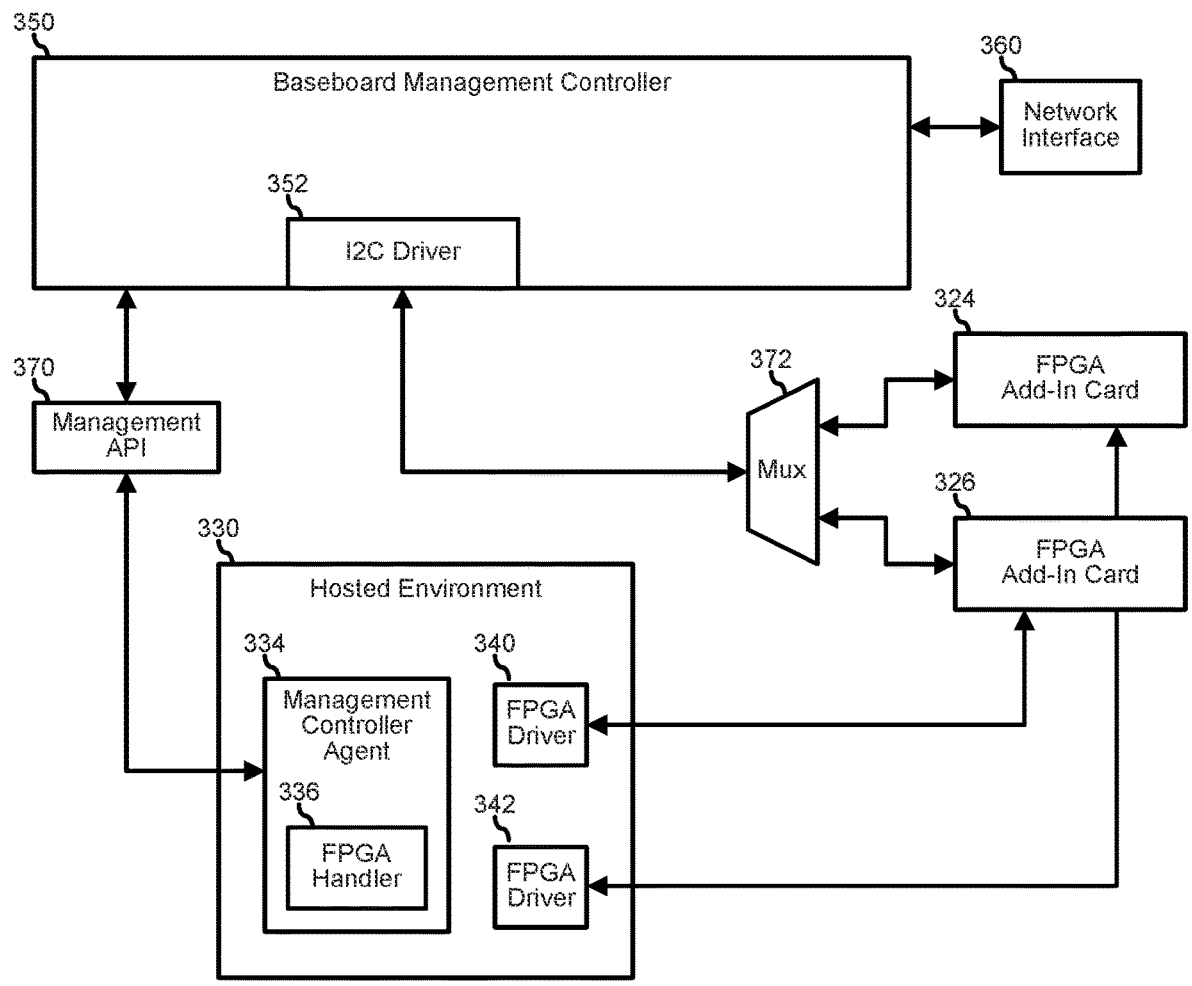
FIG. 3 is a block diagram of detailing application and software level components of an information handling including FPGA add-in cards according to an embodiment of the present disclosure.

FIG. 3 illustrates an information handling system 300 similar to information handling system 100, with emphasis on software and application level components for managing FPGAs 200. Here, information handling system 300 is illustrated as including a hosted environment 330 similar to hosted environment 130, FPGA add-in cards 324 and 326 similar to FPGAs 124 and 126 and to FPGA add-in card 200, a BMC 350 similar to BMC 150, a management network interface 360 similar to management network interface 160, a manageability application program interface (API) 370, and an Inter-Integrated Circuit ($I^2C$) multiplexor 372. Hosted environment 330 includes management controller agent 334 similar to management controller agent 134, and FPGA drivers 340 and 342 similar to FPGA drivers 140 and 142. Management controller agent 334 includes FPGA handler 336 similar to FPGA handler 136. BMC 350 includes an $I^2C$ driver 352.

FPGA drivers 340 and 342 operate to control FPGA add-in cards 324 and 326, and to provide an interface to enable a hosted OS and other components of hosted environment 330 to access vendor specific functions and features for configuring, monitoring, and controlling the FPGAs, including programming the FPGA add-in cards with the AFUs needed to perform the desired processing tasks. Here, FPGA drivers 340 and 342 operate in-hand with the operations of hosted environment 330, for example via PCIe interfaces to FPGAs 324 and 326.

BMC 350 is connected via manageability API 370 to interact with various functions and features of hosted environment 330. As such, manageability API 370 represents a standards-based communication API that provide a uniform set of functions and features for the management of a hosted environment by BMC 350. An example of manageability API 370 includes a Redfish API in accordance with a Redfish Standard published by the Distributed Management Task Force (DMTF), or another API configured to manage communications between a hosted environment and a BMC. In a particular embodiment, BMC 350 operates via manageability API 370 to access the various in-band functions and features of FPGA drivers 340 and 342 to permit the user to access the in-band monitoring features of the FPGAs, as described above.

BMC 350 is connected via $I^2C$ driver 352 to $I^2C$ multiplexor 372 to interact out-of-band with FPGAs 324 and 326. For example, BMC 350 can receive out-of-band status information from FPGAs 324 and 326, such as the number and type of AFUs that are operating on FPGA add-in cards 324 and 326, and the like. In a particular embodiment, BMC 350 operates to program FPGA add-in cards 324 and 326 with the AFUs needed to perform the desired processing tasks. In particular, BMC 350 operates to determine the number and type of AFUs that are programmed onto FPGA add-in cards 324 and 326 by providing a Platform Level Data Model (PLDM) command to the FPGA add-in cards via I2C driver 352. Once BMC 350 has received the number and type of the AFUs programmed onto FPGA add-in cards 324 and 326, the BMC operates to select one or more of the AFUs to enable or to disable, and sets up the FPGA add-in cards to modify or change the programming associated with one or more of the disabled AFUs. Here, BMC 350 operates to provide a PLDM command to FPGA add-in cards 324 and 326 via I2C driver 352 to set up the FPGA add-in cards to receive the new or modified AFUs and to program the FPGA add-in cards with the new or modified AFUs. As illustrated, BMC 350 is connected via $I^2C$ driver 352 to $I^2C$ multiplexor 372, and is understood to communicate via a $I^2C$ protocol, but this is not necessarily so, and other protocols, busses, or links may be utilized, such as a PCIe Vendor Defined Message (VDM) that utilizes peer-to-peer communications, as needed or desired. Further, it will be understood that command protocols may be utilized other than PLDM, as needed or desired.

In contrast to the programming of FPGA add-in cards 324 and 326 from hosted environment 330, that is, via FPGA drivers 340 and 342, the programming of the AFUs in the FPGA add-in cards via BMC 350 provides several advantages. As a first matter, programming of the AFUs in FPGA add-in cards 324 and 326 via BMC 350 permits a one-to-many approach to managing AFUs and the associated processing tasks on a datacenter level. Here, a management system connected to BMC 350 via management network interface 360 can update multiple information handling systems similar to information handling system 300 without interrupting the hosted environments of instantiated on the information handling systems, and thereby leaving the hosted environments free to perform the desired processing tasks without consuming processing bandwidth of the hosted environments.

Figure 4:
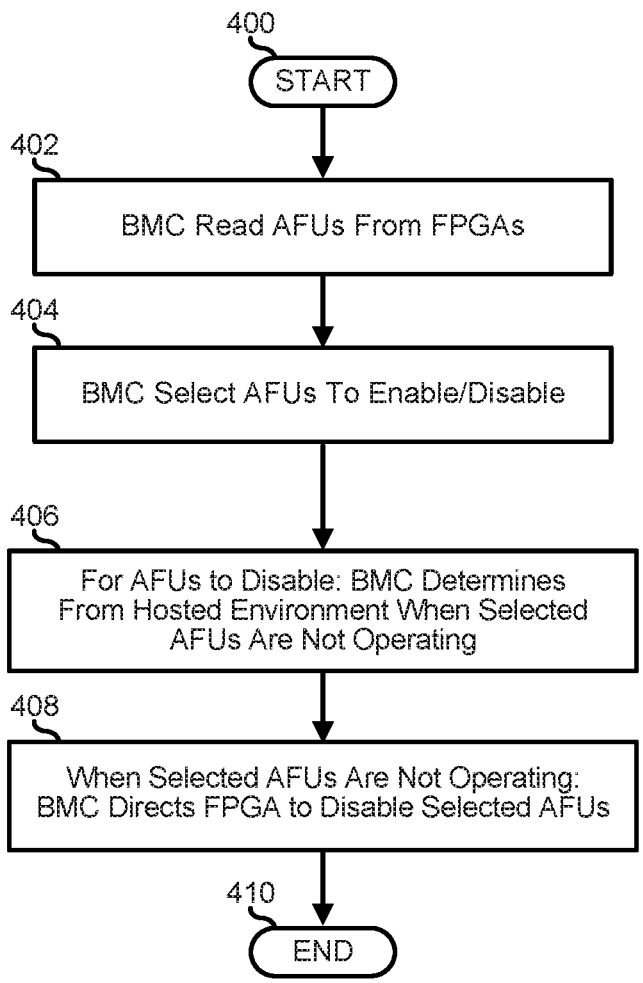
FIG. 4 is a flowchart illustrating a method for modifying and changing accelerated function units (AFUs) programmed on FPGAs via a baseboard management controller (BMC) according to an embodiment of the present disclosure.

FIG. 4 illustrates a method for modifying and changing the AFUs programmed on FPGAs via a BMC, starting at block 400. A BMC of an information handling system reads the AFUs that are programmed onto one or more FPGA in block 402. Here, the BMC may operate to provide a PLDM command to the FPGAs via an I2C interface of the BMC to retrieve AFU status information from the FPGAs, thereby avoiding the excessive utilization of the resources of a hosted environment of the information handling system. The BMC selects various AFUs to be enabled or disabled in block 404. Exemplary embodiments where a BMC may need to select various AFUs to be enabled or disabled are provided below. For the selected AFUs to be disabled, the BMC determines from the hosted environment when the selected AFUs operations have been halted in block 406. Here, it may not be advantageous to disable a particular AFU without involving the hosted environment because disabling that AFU may result in errors that would need to be handled by the hosted environment, such as by an interrupt handler of the hosted environment. In a particular embodiment, in addition to determining from the hosted environment when the selected AFUs operations have been halted, the BMC directs the hosted environment to disable the selected AFUs, and receives an indication from the hosted environment as to when the selected AFUs have been disabled by the hosted environment. Here, the BMC may interact with the hosted environment via a management API that accesses a management controller agent of the hosted environment, and the management controller agent can direct the FPGAs to halt the selected AFUS and determine when the AFUs have been halted via FPGA drivers instantiated in the hosted environment. When the BMC receives the indication from the hosted environment that a selected AFU is halted the BMC directs the FPGA to disable the halted AFU in block 408 and the method ends in block 410. Here, the BMC may operate to provide a PLDM command to the FPGAs via the I2C interface to direct the FPGA to disable the halted AFU, thereby avoiding the excessive utilization of the resources of the hosted environment.

Returning to FIG. 3, it may be noted that FPGA add-in cards 324 and 326 operate to consume a large amount of system power when large portions of the associated FPGAs are programmed and being utilized for the various processing tasks demanded by hosted environment 330. Thus, thermal management may be a challenge for the successful integration of FPGAs into an information handling system. However, typical methods for reducing power in the components of an information handling system, such as lowering an operating voltage, lowering an operating frequency, or the like, in response to an indication of a high temperature of the components, may not be easily applied to an FPGA. For example, the timing parameters utilized in a particular AFU may be closely associated with the operating frequency of the FPGA, such that reducing the operating frequency of the FPGA could lead to errors in the processing of the task associated with the AFU.

It will be understood that many FPGA implementations provide for parallel processing of large quantities of data by programming the FPGAs with multiple copies of the various AFUs. In a particular embodiment, BMC 350 operates to receive a temperature indication or another power level indication from FPGA add-in cards 324 and 326. Then, when the temperature indication from one or more of FPGA add-in cards 324 and 326 indicates that the temperature of the FPGA add-in card has exceeded a temperature threshold, BMC 350 operates to select various AFUs operating on the FPGA add-in card to shut down. Here, BMC 350 can operate as described above to select AFUs, to direct hosted environment 330 to cease the operations on the selected AFUs, and to disable the selected AFUs. In disabling an AFU, BMC 350 may operate to deprogram the FPGA of the affected FPGA add-in card, thereby reducing the power level of the affected FPGA add-in card even further.

FIG. 5 illustrates a FPGA 500 in a first state before a thermal event and in a second state after the thermal event. In the first state, FPGA 500 is programmed with 36 AFUs, including 18 instantiations of a first type of AFU (A), 12 instantiations of a second type of AFU (B), and six instantiations of a third type of AFU (C). When the thermal event occurs, a BMC receives an indication, such as a temperature indication or another power level indication, that the thermal event has occurred on FPGA 500. Here, the BMC determines to shut down half of the AFUs in order to reduce the power consumption on FPGA 500. Thus, in the second state, FPGA 500 is programmed with 18 AFUs, including nine of the first type of AFU (A), six of the second type of AFU (B), and three of the third type of AFU (C). Note that as illustrated, the excess AFUs have been deprogrammed from FPGA 500, but this is not necessarily so. In another case, the BMC may merely direct the hosted environment to halt the processing on the selected AFUs, while maintaining FPGA 500 in a programmed state. That is, all 36 AFUs may remain programmed on FPGA 500, but after the thermal event, only half of the AFUs are processing data. In this way, the BMC may quickly respond to changes in the thermal condition of FPGA 500. For example, if, during a thermal event, selected AFUs are directed to halt processing operations, but are maintained on FPGA 500, then, after the thermal event, the BMC may simply redirect the hosted environment to resume processing operations on the halted AFUs without having to reprogram the FPGA.

Note further that in the illustrated example, half of the AFUs are shut down in response to a thermal event, but this is not necessarily so. In particular, in response to a thermal event, the BMC may determine to shut down fewer AFUs or may determine to shut down a greater number of AFUs, as needed or desired. Further, it will be understood that the BMC may implement more than one thermal threshold, and may take successively more extreme action as the temperature of FPGA 500 continues to rise. That is, when a lower temperature threshold is exceeded, the BMC may shut down a smaller number of AFUs than when a higher temperature threshold is exceeded. In a particular embodiment, the BMC employs machine learning techniques to monitor the results from shutting down a particular number of AFUs in response to a thermal event, and, upon a subsequent thermal event, may determine to shut down fewer AFUs or may determine to shut down a greater number of AFUs, based upon the response of FPGA 500 to the prior thermal event.

Figure 6:
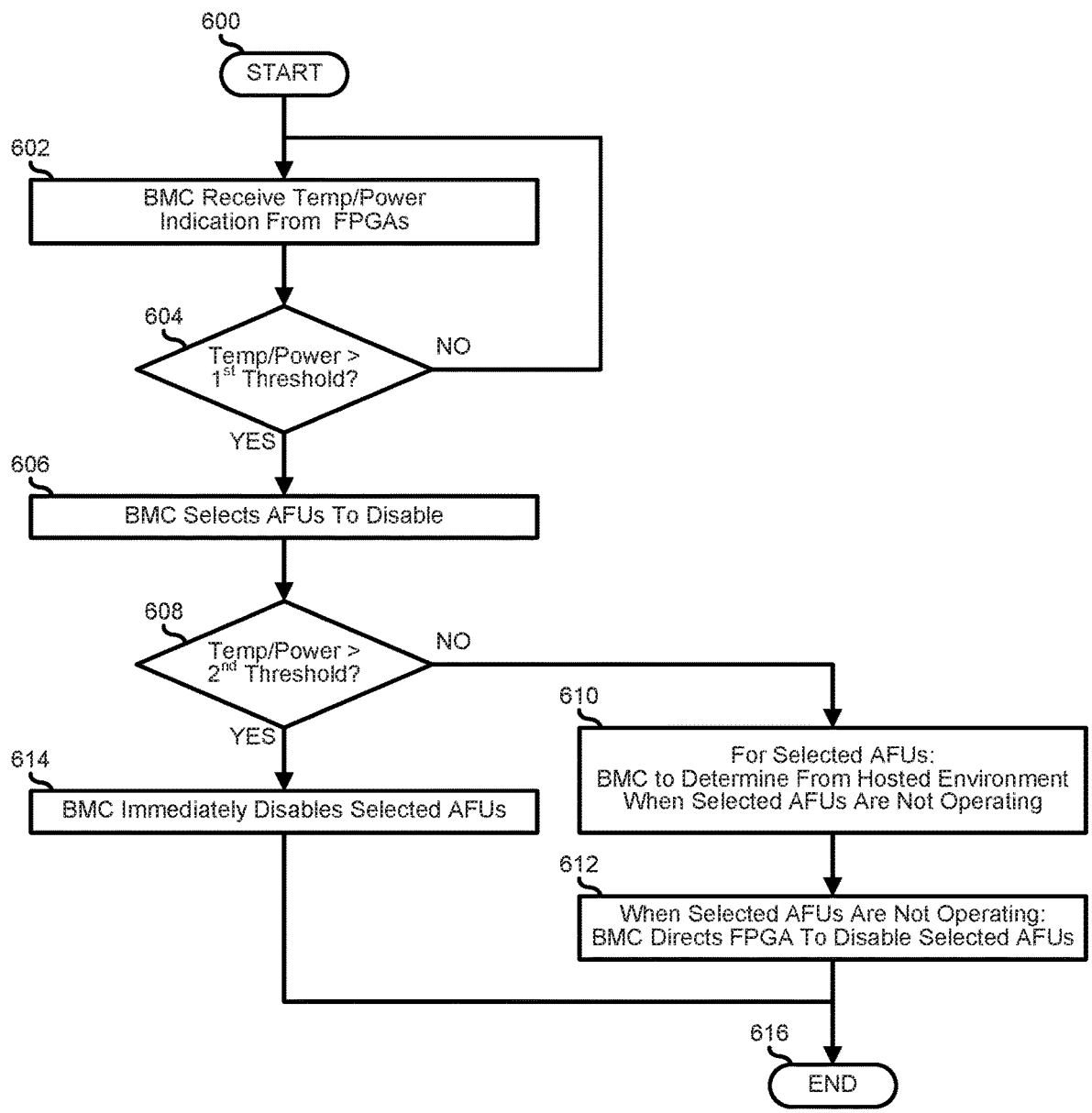
FIG. 6 is a flowchart illustrating a method for providing power management in FPGAs via a BMC according to an embodiment of the present disclosure.

FIG. 6 illustrates a method for providing power management in FPGAs via a BMC, starting at block 600. A BMC of an information handling system receives a temperature/power indication from the FPGAs of the information handling system in block 602. A decision is made as to whether or not the temperature/power indication is greater than a first temperature/power threshold in decision block 604. If not, the "NO" branch of decision block 604 is taken and the method returns to block 602 where the BMC receives the temperature/power indication. If the temperature/power indication is greater than a first temperature/power threshold, the "YES" branch of decision block 604 is taken and the BMC determines one or more AFU from the affected FPGA to disable in block 606. A decision is made as to whether or not the temperature/power indication is greater than a second, higher temperature/power threshold in decision block 608.

Here, the first threshold can represent a "warning" threshold, while the second threshold can represent a "critical" threshold. As such, if the temperature/power indication is not greater than a second, higher temperature/power threshold, the temperature of the affected FPGA is in the warning level and is not critical. Here, the "NO" branch of decision block 608 is taken, and, for the AFUs selected to be disabled, the BMC determines from the hosted environment when the selected AFUs operations have been halted in block 610. Here, because the affected FPGA is in the warning level, the BMC may opportunistically disable the AFUs as the processing tasks that they are working on are completed, and those AFUs do not need to be halted prematurely. As such, when the BMC receives the indication from the hosted environment that a selected AFU is halted the BMC directs the FPGA to disable the halted AFU in block 612 and the method ends in block 616. When the temperature/power indication is greater than both the first and second temperature/power thresholds, as determined in decision block 608, the temperature of the affected FPGA is in the critical level. Here, the "YES" branch of decision block 608 is taken, and, for the AFUs selected to be disabled, the BMC immediately halts the selected AFUs in block 614 and the method ends in block 616.

Returning to FIG. 3, it will be understood that the processing demands of the various AFUs that are to be programmed onto FPGA add-in cards 324 and 326 may represent different requirements in terms of processing power, memory capacity, storage or network accessibility, or the like that are needed to be provided by the FPGA add-in cards in order to perform the processing tasks of the various AFUs. Where all of FPGA add-in cards 324 and 326 represent a common type of FPGA add-in card, such considerations may be more dominated by the performance of a nearest CPU of hosted environment 330, for example when a particular FPGA add-in card is installed in an I/O connector associated with a particular processor of a multi-processor system. On the other hand, where one or more of FPGA add-in cards 324 and 326 is of a different type than the other FPGA add-in cards, such may be more related to the capabilities of the particular FPGA add-in cards.

Moreover, while one or more of FPGA add-in cards 324 and 326 may provide the required functionality to execute a particular AFU, it may yet be more desirable to execute that AFU on one FPGA add-in card than the other FPGA add-in cards. For example, where a workload that utilizes a particular AFU also requires large data transfers to different non-FPGA add-in cards, such as a general purpose processing unit (GPU) or a network card, it may be more desirable to instantiate that AFU on a FPGA add-in card that is running on the same root complex as the GPU or network card.

In a particular embodiment, FPGA handler 336 operates to inventory FPGA add-in cards 324 and 326 to determine their respective configurations. For example, FPGA handler 336 can determine a closest CPU for each of FPGA add-in cards 324 and 326, and can read the capabilities of the FPGA add-in cards in terms of processing power, memory capacity, storage or network accessibility, or the like. FPGA handler 336 further operates to determine the personality of each of the AFUs that are to be instantiated on FPGA add-in cards 324 and 326. Then, having the inventory of FPGA add-in cards 324 and 326 and the personality information for the AFUs that are to be instantiated on the FPGA add-in cards, FPGA handler 336 operates map the AFUs to the FPGA add-in cards, optimizing the programming of the FPGA add-in cards with the AFUs in order to optimize performance. In a particular embodiment, FPGA handler 336 maps the AFUs to the FPGA add-in cards at an initialization of hosted environment 330, such as after a POST process when an operating system is launched on the hosted environment. In a particular embodiment, the AFUs include metadata defining to the personality of the AFUs, for example in terms of the different requirements in terms of processing power, memory capacity, storage or network accessibility, or the like that are needed to be provided by the FPGA add-in cards in order to perform the processing tasks of the particular AFUs.

Further, during run time, FPGA handler 336 operates to modify the mapping of the AFUs to FPGA add-in cards 324 and 326 in response to instructions from BMC 350. Here, a management system connected to network interface 360, and part of a management network for a datacenter that includes information handling system 300, may provide instructions to BMC 330 to halt the processing of various AFUs and to program new AFUs to FPGA add-in cards 324 and 326. For example, where the processing needs of the datacenter change over time, the management system can coordinate a one-to-many restructuring of the AFUs in the various information handling systems of the data center. Here, when instructed to instantiate a different set of AFUs by BMC 350, FPGA handler 336 operates to evaluate the personalities of the new AFUs in terms of the capabilities of information handling system 300 and FPGA add-in cards 324 and 326, and to remap the new AFUs to the FPGA add-in cards.

It will be further understood that a typical FPGA will provide homogeneous AFU slots for the programming of AFUs into the FPGA. In particular, a typical FPGA will be specified as providing a certain number of programmable slots of a more or less common size, into which AFUs can be programmed. Thus, a particular AFU may be programmed into one or more programmable slot, and that AFU will be provisioned with access to the resources of the FPGA based upon the number of programmable slots needed to program the AFU. Thus, a particular AFU may behave differently on a typical FPGA based upon which physical slots are utilized for programming the AFU. For example, given two instantiations of a particular AFU, the first AFU may operate faster because the particular mix of physical slots and their relative locations may be amenable to a lower propagation delay when processing data than may be achieved with the second AFU, or the second AFU may provide faster memory or network performance based upon its being programmed into slots that are physically closer to the associated interfaces. However, in the typical FPGA, a user has only very course insight or control over the placement of AFUs, and has little flexibility to optimize the programming of the AFUs within the FPGA.

In a particular embodiment, FPGA add-in cards 324 and 326 operate to characterize their operations and programmability in terms of propagation delay within an AFU, proximity to the various interconnect fabrics and interfaces, density and size of the AFUs, heat map and power consumption within the AFUs, and the like. Here, a particular FPGA add-in card may be characterized at the time of manufacture or at a later run time environment to determine the vagaries of the particular FPGA add-in card. Here, characterization information is stored in a Serial Presence Interface ROM (SPI-ROM) or another non-volatile storage of the FPGA add-in card. At power up, BMC 350 communicates with a card BMC of FPGA add-in cards 324 and 326 to retrieve the characterization information from the FPGA add-in cards. Then, based upon FPGA handler 336 understanding the needs of the AFUs that are to be programmed onto FPGA add-in cards 324 and 326, as described above, BMC 350 operates to optimize the programming of AFUs onto the FPGA add-in cards. For example, while FPGA handler 336 operates to determine an optimum one of FPGA add-in cards 324 and 326 onto which to program a particular AFU, BMC 350, in communication with the card BMCs of the FPGA add-in cards, further operates to optimize the programming of the selected AFUs onto the selected FPGA add-in cards. It will be understood that the slots of FPGA add-in cards 324 and 326 may be categorized into their respective affinities for various metrics, including propagation delay, bus width, number of lanes in a link, quality-of-service (QoS) level, speed grade within the FPGA silicon, proximity to High Bandwidth Memory (HBM), on-card memory, PCIe interfaces, and the like.

Figure 7:
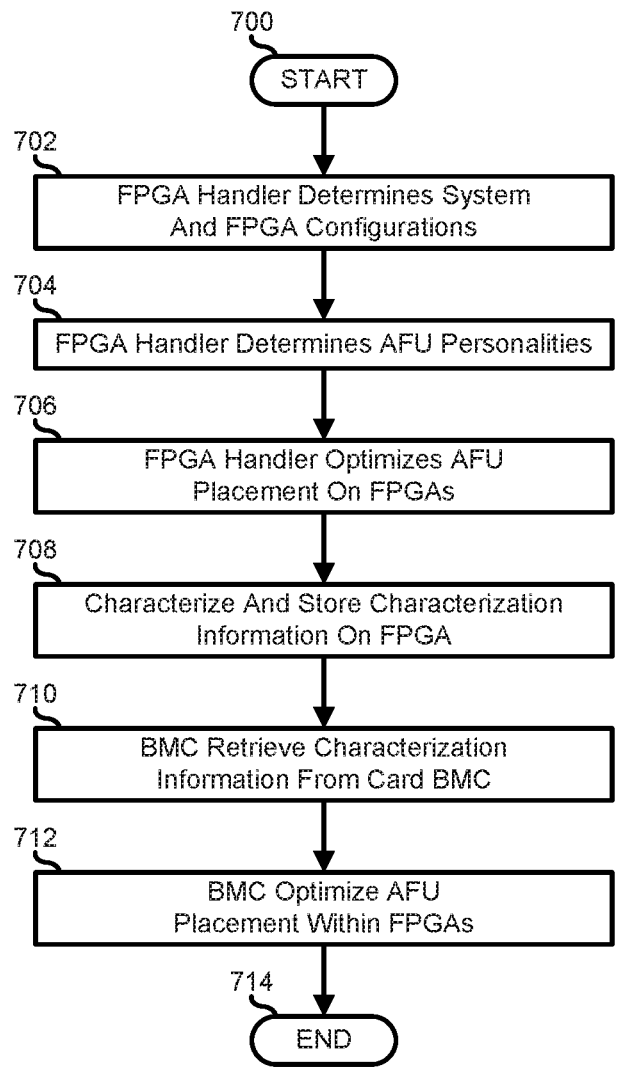
FIG. 7 is a flowchart illustrating a method for providing load balancing and optimizing AFU placement in FPGAs via a BMC according to an embodiment of the present disclosure.

FIG. 7 illustrates a method for providing load balancing in FPGAs via a BMC, starting at block 700. A FPGA handler of a hosted environment determines the system and FPGA configurations within an information handling system in block 702. For example, FPGA handler 336 can determine a closest CPU for each of FPGA add-in cards 324 and 326, and can read the capabilities of the FPGA add-in cards in terms of processing power, memory capacity, storage or network accessibility, or the like. The FPGA handler determines the personalities of the AFUs that are to be instantiated on the FPGAs in block 704. For example, FPGA handler 336 can determine the personality of each of the AFUs that are to be instantiated on FPGA add-in cards 324 and 326 in terms of the needed processing power, memory capacity, storage or network accessibility, or the like. The FPGA hander maps the AFUs to the FPGA, optimizing the programming of the FPGA add-in cards with the AFUs in order to optimize performance in block 706.

In a separate operation, the characterization information for the FPGAs and the associated slots is determined and stored onto the FPGAs in block 708. For example, a manufacturer may characterize their FPGAs and store the characterization information to a SPI-ROM for access by the card BMC, or the card BMC may perform a run time characterization to determine the characterization information. The BMC retrieves the characterization information from the card BMC in block 710. For example, BMC 350 can access card BMCs on FPGA add-in cards 324 and 326 via I2C driver 352 and I2C multiplexor 372 to read the characterization information from the BMC add-in cards. The BMC optimizes the placement of the AFUs within the FPGAs selected by the FPGA handler in block 712 and the method ends in block 714.

Figure 8:
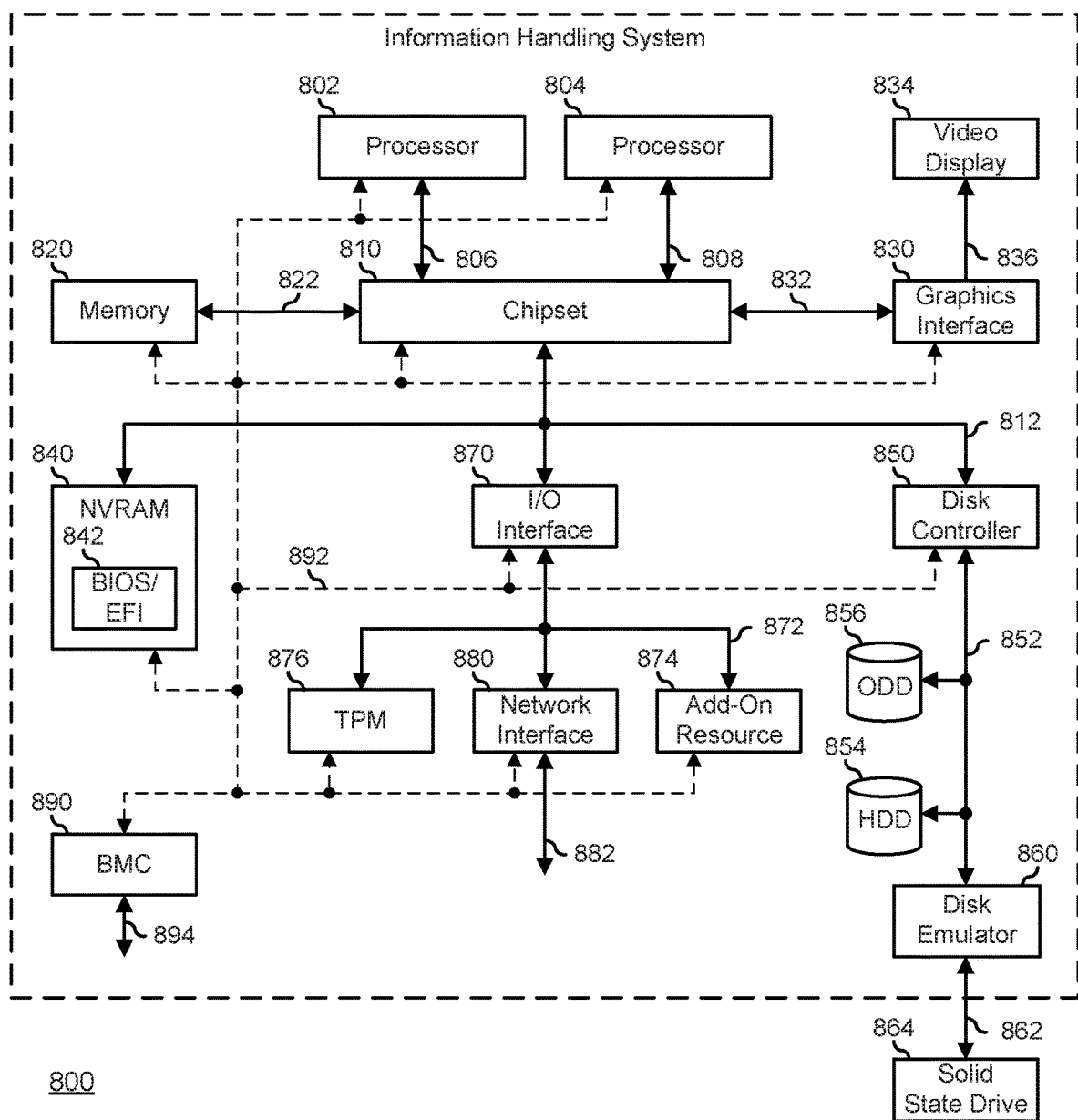
FIG. 8 is a block diagram illustrating a generalized information handling system according to an embodiment of the present disclosure.

FIG. 8 illustrates a generalized embodiment of information handling system 800. For purpose of this disclosure information handling system 800 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 800 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 800 can include processing resources for executing machine-executable code, such as a central processing unit (CPU), a programmable logic array (PLA), an embedded device such as a System-on-a-Chip (SoC), or other control logic hardware. Information handling system 800 can also include one or more computer-readable medium for storing machine-executable code, such as software or data. Additional components of information handling system 800 can include one or more storage devices that can store machine-executable code, one or more communications ports for communicating with external devices, and various input and output (I/O) devices, such as a keyboard, a mouse, and a video display. Information handling system 800 can also include one or more buses operable to transmit information between the various hardware components.

Information handling system 800 includes processors 802 and 804, a chipset 810, a memory 820, a graphics adapter 830 connected to a video display 834, a non-volatile RAM (NV-RAM) 840 that includes a basic input and output system/extensible firmware interface (BIOS/EFI) module 842, a disk controller 850, a hard disk drive (HDD) 854, an optical disk drive 856, a disk emulator 860 connected to a solid state drive (SSD) 864, an input/output (I/O) interface 870 connected to an add-on resource 874 and a trusted platform module (TPM 876, a network interface 880, and a baseboard management controller (BMC) 890. Processor 802 is connected to chipset 810 via processor interface 806, and processor 804 is connected to the chipset via processor interface 808. In a particular embodiment, processors 802 and 804 are connected together via a high-capacity coherent fabric, such as a HyperTransport link, a QuickPath Interconnect, or the like. Chipset 810 represents an integrated circuit or group of integrated circuits that manages the data flows between processors 802 and 804 and the other elements of information handling system 800. In a particular embodiment, chipset 810 represents a pair of integrated circuits, such as a northbridge component and a southbridge component. In another embodiment, some or all of the functions and features of chipset 810 are integrated with one or more of processors 802 and 804. Memory 820 is connected to chipset 810 via a memory interface 822. An example of memory interface 822 includes a Double Data Rate (DDR) memory channel and memory 820 represents one or more DDR Dual In-Line Memory Modules (DIMMs). In a particular embodiment, memory interface 822 represents two or more DDR channels. In another embodiment, one or more of processors 802 and 804 include a memory interface that provides a dedicated memory for the processors. A DDR channel and the connected DDR DIMMs can be in accordance with a particular DDR standard, such as a DDR3 standard, a DDR4 standard, a DDR5 standard, or the like. Memory 820 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like. Graphics adapter 830 is connected to chipset 810 via a graphics interface 832, and provides a video display output 836 to a video display 834. An example of a graphics interface 832 includes a Peripheral Component Interconnect-Express (PCIe) interface and graphics adapter 830 can include a four lane (×4) PCIe adapter, an eight lane (×8) PCIe adapter, a 16-lane (×16) PCIe adapter, or another configuration, as needed or desired. In a particular embodiment, graphics adapter 830 is provided down on a system printed circuit board (PCB). Video display output 836 can include a Digital Video Interface (DVI), a High-Definition Multimedia Interface (HDMI), a DisplayPort interface, or the like, and video display 834 can include a monitor, a smart television, an embedded display such as a laptop computer display, or the like.

NV-RAM 840, disk controller 850, and I/O interface 870 are connected to chipset 810 via an I/O channel 812. An example of I/O channel 812 includes one or more point-to-point PCIe links between chipset 810 and each of NV-RAM 840, disk controller 850, and I/O interface 870. Chipset 810 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. NV-RAM 840 includes BIOS/EFI module 842 that stores machine-executable code (BIOS/EFI code) that operates to detect the resources of information handling system 800, to provide drivers for the resources, to initialize the resources, and to provide common access mechanisms for the resources. The functions and features of BIOS/EFI module 842 will be further described below.

Disk controller 850 includes a disk interface 852 that connects the disc controller to a hard disk drive (HDD) 854, to an optical disk drive (ODD) 856, and to disk emulator 860. An example of disk interface 852 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 860 permits a solid-state drive (SSD) 864 to be connected to information handling system 800 via an external interface 862. An example of external interface 862 includes a USB interface, a proprietary interface, or a combination thereof. Alternatively, solid-state drive 864 can be disposed within information handling system 800.

I/O interface 870 includes a peripheral interface 872 that connects the I/O interface to add-on resource 874, to TPM 876, and to network interface 880. Peripheral interface 872 can be the same type of interface as I/O channel 812, or can be a different type of interface. As such, I/O interface 870 extends the capacity of I/O channel 812 when peripheral interface 872 and the I/O channel are of the same type, and the I/O interface translates information from a format suitable to the I/O channel to a format suitable to the peripheral channel 872 when they are of a different type. Add-on resource 874 can include a data storage system, an additional graphics interface, a network interface card (NIC), a sound/video processing card, another add-on resource, or a combination thereof. Add-on resource 874 can be on a main circuit board, on separate circuit board or add-in card disposed within information handling system 800, a device that is external to the information handling system, or a combination thereof.

Network interface 880 represents a network communication device disposed within information handling system 800, on a main circuit board of the information handling system, integrated onto another component such as chipset 810, in another suitable location, or a combination thereof. Network interface device 880 includes a network channel 882 that provides an interface to devices that are external to information handling system 800. In a particular embodiment, network channel 882 is of a different type than peripheral channel 872 and network interface 880 translates information from a format suitable to the peripheral channel to a format suitable to external devices. In a particular embodiment, network interface 880 includes a network interface card (NIC) or host bus adapter (HBA), and an example of network channel 882 includes an InfiniBand channel, a Fibre Channel, a Gigabit Ethernet channel, a proprietary channel architecture, or a combination thereof. In another embodiment, network interface 880 includes a wireless communication interface, and network channel 882 includes a WiFi channel, a near-field communication (NFC) channel, a Bluetooth or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 882 can be connected to an external network resource (not illustrated). The network resource can include another information handling system, a data storage system, another network, a grid management system, another suitable resource, or a combination thereof.

BMC 890 is connected to multiple elements of information handling system 800 via one or more management interface 892 to provide out of band monitoring, maintenance, and control of the elements of the information handling system. As such, BMC 890 represents a processing device different from processor 802 and processor 804, which provides various management functions for information handling system 800. For example, BMC 890 may be responsible for power management, cooling management, and the like. The term baseboard management controller (BMC) is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers.

Capabilities and functions provided by BMC 890 can vary considerably based on the type of information handling system. BMC 890 can operate in accordance with an Intelligent Platform Management Interface (IPMI). Examples of BMC 890 include an Integrated Dell Remote Access Controller (iDRAC). Management interface 892 represents one or more out-of-band communication interfaces between BMC 890 and the elements of information handling system 800, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a Peripheral Component Interconnect-Express (PCIe) interface, a Network Controller Sideband Interface (NC-SI), or the like. As used herein, out-of-band access refers to operations performed apart from a BIOS/operating system execution environment on information handling system 800, that is apart from the execution of code by processors 802 and 804 and procedures that are implemented on the information handling system in response to the executed code. BMC 890 operates to monitor and maintain system firmware, such as code stored in BIOS/EFI module 842, option ROMs for graphics interface 830, disk controller 850, add-on resource 874, network interface 880, or other elements of information handling system 800, as needed or desired. In particular, BMC 890 includes a network interface 894 that can be connected to a remote management system to receive firmware updates, as needed or desired. Here, BMC 890 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 890 utilizes various protocols and application programming interfaces (APIs) to direct and control the processes for monitoring and maintaining the system firmware. An example of a protocol or API for monitoring and maintaining the system firmware includes a graphical user interface (GUI) GUI associated with BMC 890, an interface defined by the Distributed Management Taskforce (DMTF) (such as a Web Services Management (WS-MAN) interface, a Management Component Transport Protocol (MCTP) or, a Redfish interface), various vendor defined interfaces (such as a Dell EMC Remote Access Controller Administrator (RACADM) utility, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 890 is included on a main circuit board (such as a baseboard, a motherboard, or any combination thereof) of information handling system 800, or is integrated onto another element of the information handling system such as chipset 810, or another suitable element, as needed or desired. As such, BMC 890 can be part of an integrated circuit or a chip set within information handling system 800. An example of BMC 890 includes an integrated Dell remote access controller (iDRAC), or the like. BMC 890 may operate on a separate power plane from other resources in information handling system 800. Thus BMC 890 can communicate with the management system via network interface 894 while the resources of information handling system 800 are powered off. Here, information can be sent from the management system to BMC 890 and the information can be stored in a RAM or NV-RAM associated with the BMC. Information stored in the RAM may be lost after power-down of the power plane for BMC 890, while information stored in the NV-RAM may be saved through a power-down/power-up cycle of the power plane for the BMC.

The preceding description in combination with the Figures is provided to assist in understanding the teachings disclosed herein. The preceding discussion focused on specific implementations and embodiments of the teachings. This focus has been provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
a processor;
a system baseboard management controller (BMC); and
a field-programmable gate array (FPGA) add-in card, including:
an FPGA configured to be programmed with a plurality of accelerated function units (AFUs), the AFUs to perform processing tasks for the processor, the AFUs including a first one of a first type and a second one of the first type; and
a card BMC configured to provide a temperature indication to the system BMC;
wherein the system BMC is configured to:
receive the temperature indication;
determine that a temperature of the FPGA add-in card exceeds a first temperature threshold based upon the temperature indication;
select the first AFU to be disabled in response to the temperature of the FPGA add-in card exceeding the first temperature threshold; and
direct the card BMC to disable the first AFU; and
wherein the card BMC is configured to disable the first AFU and not the second AFU in response to the direction to disable the first AFU.

2. The information handling system of claim 1, wherein, prior to directing the card BMC to disable the first AFU, the system BMC is further configured to:
direct the processor to halt a first processing task associated with the first AFU; and
receive a second indication from the processor that the first processing task is halted, wherein directing the card BMC to disable the first AFU is in response to the second indication.

3. The information handling system of claim 1, wherein:
the plurality of AFUs further includes a third AFU of the first type;
the system BMC is further configured to:
after determining that the temperature of the FPGA exceeds the first temperature threshold, determine that the temperature of the FPGA add-in card exceeds a second temperature threshold based upon the temperature indication;
select the third AFU to be disabled in response to the temperature of the FPGA add-in card exceeding the second temperature threshold; and
direct the card BMC to disable the third AFU; and
wherein the card BMC is configured to disable the third AFU and not the second AFU in response to the direction to disable the third AFU.

4. The information handling system of claim 3, wherein the system BMC directs the card BMC to disable the third AFU without determining that a second processing task associated with the third AFH has been halted.

5. The information handling system of claim 1, wherein:
the plurality of AFUs further includes a third AFU of a second type and a fourth AFU of the second type;
the system BMC is further configured to:
select the third AFU to be disabled in response to the temperature of the FPGA add-in card exceeding the first temperature threshold; and
direct the card BMC to disable the third AFU; and
wherein the card BMC is further configured to disable the third AFU and not the fourth AFU in response to the direction to disable the third AFU.

6. The information handling system of claim 1, wherein the card BMC is further configured to provide a halt indication when the first AFU has been halted.

7. The information handling system of claim 6, wherein the system BMC is further configured to direct the card BMC to deprogram the first AFU from the FPGA in response to the halt indication.

8. The information handling system of claim 7, wherein the card BMC is further configured to deprogram the first AFU from the FPGA in response to the direction from the system BMC to deprogram the first AFU.

9. The information handling system of claim 1, wherein:
the system BMC is configured to:
after determining that the temperature of the FPGA add-in card exceeds the first temperature threshold, determine that the temperature of the FPGA add-in card is lower than the temperature threshold based upon the temperature indication; and
direct the card BMC to re-enable the first AFU; and
the card BMC is configured to re-enable the first AFU in response to the direction to re-enable the first AFU.

10. The information handling system of claim 9, wherein, after directing the card BMC to re-enable the first AFU, the system BMC is further configured to:
direct the processor to re-start the first processing task; and
receive a third indication from the processor that the first processing task has been re-started.

11. A method, comprising:
programming, on a field-programmable gate array (FPGA) of an add-in card of an information handling system, a plurality of accelerated function units (AFUs), the AFUs to perform processing tasks for a processor of the information handling system, the AFUs including first and second AFUs of the first type;
providing, by a card baseboard management controller (BMC) of the FPGA add-in card, a temperature indication to a system BMC of the information handling system;
receiving, by the system BMC, the temperature indication;
determining, by the system BMC, that a temperature of the FPGA add-in card exceeds a first temperature threshold based upon the temperature indication;
selecting, by the system BMC, the first AFU to be disabled in response to the temperature of the FPGA add-in card exceeding the first temperature threshold;
directing, by the system BMC, the card BMC to disable the first AFU; and
disabling, by the card BMC, the first AFU and not the second AFU in response to the direction to disable the first AFU.

12. The method of claim 11, wherein, prior to directing the card BMC to disable the first AFU, the method further comprises:
directing, by the system BMC, a processor of the information handling system to halt a first processing task associated with the first AFU; and
receiving, by the system BMC, a second indication from the processor that the first processing task is halted, wherein directing the card BMC to disable the first AFU is in response to the second indication.

13. The method of claim 11, wherein:
the plurality of AFUs further includes a third AFU of the first type; and the method further comprises:
  after determining that the temperature of the FPGA exceeds the first temperature threshold, determining, by the system BMC, that the temperature of the FPGA add-in card exceeds a second temperature threshold based upon the temperature indication;
  selecting, by the system BMC, the third AFU to be disabled in response to the temperature of the FPGA add-in card exceeding the second temperature threshold;
  directing, by the system BMC, the card BMC to disable the third AFU; and
  disabling, by the card BMC, the third AFU and not the second AFU in response to the direction to disable the third AFU.

14. The method of claim 13, wherein the system BMC directs the card BMC to disable the third AFU without determining that a second processing task associated with the third AFU has been halted.

15. The method of claim 11, wherein:
the plurality of AFUs further includes a third AFU of a second type and a fourth AFU of the second type;
the method further comprises:
  selecting, by the system BMC, the third AFU to be disabled in response to the temperature of the FPGA add-in card exceeding the first temperature threshold;
  directing, by the system BMC, the card BMC to disable the third AFU; and
  disabling, by the card BMC, the third AFU and not the fourth AFU in response to the direction to disable the third AFU.

16. The method of claim 11, further comprising:
providing, by the card BMC, a halt indication when the first AFU has been halted.

17. The method of claim 16, further comprising:
directing, by the system BMC, the card BMC to deprogram the first AFU from the FPGA in response to the halt indication.

18. The method of claim 17, further comprising:
deprogramming, by the card BMC, the first AFU from the FPGA in response to the direction from the system BMC to deprogram the first AFU.

19. The method of claim 11, further comprising:
after determining that the temperature of the FPGA add-in card exceeds the first temperature threshold, determining, by the system BMC, that the temperature of the FPGA add-in card is lower than the temperature threshold based upon the temperature indication;
directing, by the system BMC, the card BMC to re-enable the first AFU; and
re-enabling, by the card BMC, the first AFU in response to the direction to re-enable the first AFU.

20. An information handling system, comprising:
a system baseboard management controller (BMC); and
a field-programmable gate array (FPGA) add-in card, including:
  an FPGA configured to be programmed with a plurality of accelerated function units (AFUs), the AFUs to perform processing tasks for a processor, the AFUs including a first AFU of a first type, a second AFU of the first type, and a third AFU of the first type; and
  a card BMC configured to provide a power indication to the system BMC;
wherein the system BMC is configured to:
  receive the power indication;
  determine that a power of the FPGA add-in card exceeds a first power threshold based upon the power indication;
  select the first AFU to be disabled if the power of the FPGA add-in card exceeds the first power threshold;
  direct the card BMC to disable the first AFU;
  after determining that the temperature of the FPGA exceeds the first temperature threshold, determine that the temperature of the FPGA add-in card exceeds a second temperature threshold based upon the temperature indication;
  select the third AFU to be disabled in response to the temperature of the FPGA add-in card exceeding the second temperature threshold; and
  direct the card BMC to disable the third AFU; and
wherein the card BMC is configured to disable the first AFU and not the second AFU in response to the direction to disable the first AFU, and to disable the third AFU and not the second AFU in response to the direction to disable the third AFU.

* * * * *